(12) United States Patent
Jeong et al.

(10) Patent No.: US 10,038,110 B2
(45) Date of Patent: Jul. 31, 2018

(54) SOLAR CELL BACKSHEET AND METHOD FOR PREPARING SAME

(75) Inventors: Boong-Goon Jeong, Daejeon (KR); Dong-Ryul Kim, Daejeon (KR); Myeong-Geun Ko, Daejeon (KR)

(73) Assignee: LG CHEM, LTD., Seoul (KR)

( * ) Notice: Subject to any disclaimer, the term of this patent is extended or adjusted under 35 U.S.C. 154(b) by 487 days.

(21) Appl. No.: 13/147,166

(22) PCT Filed: Feb. 2, 2010

(86) PCT No.: PCT/KR2010/000633
§ 371 (c)(1),
(2), (4) Date: Aug. 22, 2011

(87) PCT Pub. No.: WO2010/087684
PCT Pub. Date: Aug. 5, 2010

(65) Prior Publication Data
US 2011/0297221 A1 Dec. 8, 2011

(30) Foreign Application Priority Data

Feb. 2, 2009 (KR) .................. 10-2009-0008103

(51) Int. Cl.
*H01L 31/0216* (2014.01)
*B32B 27/08* (2006.01)
*B32B 5/00* (2006.01)
*C09D 127/16* (2006.01)
*B32B 37/00* (2006.01)
(Continued)

(52) U.S. Cl.
CPC ...... *H01L 31/0481* (2013.01); *B32B 2367/00* (2013.01); *Y02E 10/50* (2013.01); *Y10T 156/10* (2015.01); *Y10T 428/269* (2015.01); *Y10T 428/31583* (2015.04); *Y10T 428/31681* (2015.04); *Y10T 428/31721* (2015.04)

(58) Field of Classification Search
CPC .................. H01L 31/0481; B32B 2367/00
USPC .......................................... 136/256
See application file for complete search history.

(56) References Cited

U.S. PATENT DOCUMENTS

| 5,959,022 A | 9/1999 | Lin et al. |
| 6,420,033 B1 * | 7/2002 | Numrich ............. B29C 47/0021 264/211.12 |

(Continued)

FOREIGN PATENT DOCUMENTS

| JP | 61-141715 A | 6/1986 |
| JP | 62-109811 A | 5/1987 |

(Continued)

OTHER PUBLICATIONS

Excerpt from the Chemical Dictionary III, p. 920 (Oct. 1, 2003).

*Primary Examiner* — Sadie White
(74) *Attorney, Agent, or Firm* — Dentons US LLP

(57) ABSTRACT

Provided are a solar cell backsheet including a substrate layer and a blended resin layer including a fluorine-based resin and a (meth)acrylic-based copolymer resin including a (meth)acrylic-based monomer and a maleimide-based monomer formed on at least one surface of the substrate layer, a method of manufacturing the solar cell backsheet, and a solar cell including the solar cell backsheet. Since using the solar cell backsheet provided here can lower a temperature in a solar cell, and improved heat-resistance, weather-resistance, etc. of the solar cell are achieved.

9 Claims, 1 Drawing Sheet

BLENDED RESIN LAYER(FLUORINE-BASED RESIN/(METH)ACRYLIC-BASED COPOLYMER)

PET

BLENDED RESIN LAYER(FLUORINE-BASED RESIN/(METH)ACRYLIC-BASED COPOLYMER)

(51) Int. Cl.
    *B32B 37/12*     (2006.01)
    *C09D 135/00*     (2006.01)
    *B32B 15/08*     (2006.01)
    *B32B 7/12*     (2006.01)
    *H01L 31/048*     (2014.01)

(56) References Cited

U.S. PATENT DOCUMENTS

| | | | |
|---|---|---|---|
| 2005/0133085 A1* | 6/2005 | Shimada | 136/255 |
| 2008/0156367 A1 | 7/2008 | Uschold et al. | |
| 2008/0261037 A1 | 10/2008 | Snow | |
| 2009/0226730 A1* | 9/2009 | Hoess | B32B 27/18 |
| | | | 428/424.4 |
| 2009/0260677 A1* | 10/2009 | DeBergalis et al. | 136/251 |
| 2010/0189975 A1* | 7/2010 | Kakuno et al. | 428/213 |
| 2011/0030756 A1* | 2/2011 | Honda et al. | 136/244 |
| 2011/0226313 A1* | 9/2011 | Lefebvre et al. | 136/251 |

FOREIGN PATENT DOCUMENTS

| | | | |
|---|---|---|---|
| JP | 2002-100788 A | 4/2002 | |
| JP | 2007-266382 A | 10/2007 | |
| JP | 2008-211034 A | 9/2008 | |
| KR | 10-2008-0065844 | 7/2008 | |
| WO | WO 2007/088930 | 8/2007 | |
| WO | WO 2007/119767 | 10/2007 | |
| WO | WO 2007/148754 | 12/2007 | |
| WO | 2008/157159 A1 | 12/2008 | |
| WO | PCT/JP2008/063584 * | 5/2009 | B32B 27/08 |
| WO | WO 2009130867 A1 * | 10/2009 | |

\* cited by examiner

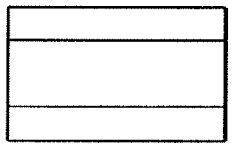 BLENDED RESIN LAYER(FLUORINE-BASED RESIN/(METH)ACRYLIC-BASED COPOLYMER)
PET
BLENDED RESIN LAYER(FLUORINE-BASED RESIN/(METH)ACRYLIC-BASED COPOLYMER)

SOLAR CELL BACKSHEET AND METHOD FOR PREPARING SAME

CROSS-REFERENCE TO RELATED APPLICATION

This application is a National Stage Entry of International Application No. PCT/KR2010/000633, filed on Feb 2, 2010, and claims priority to and the benefit of Korean Patent Application No. 10-2009-0008103, filed on Feb. 2, 2009, the disclosures of which are incorporated herein by reference in their entirety.

BACKGROUND

1. Field of the Invention

The present invention relates to a solar cell backsheet including a fluorine-based resin layer and a substrate layer, and more particularly, to a solar cell backsheet having improved heat-resistance and durability, a method of manufacturing the solar cell backsheet, and a solar cell including the solar cell backsheet.

2. Discussion of Related Art

Lately, the problem of global warming has attracted the attention of several fields, and there are various ongoing efforts to reduce carbon dioxide emissions. Increase in the consumption of fossil fuels leads to an increase in atmospheric carbon dioxide, which has numerous adverse effects on the global environment, including global temperature rise via the greenhouse effect. To solve these problems, various studies are underway. In particular, expectations for photovoltaic power generation are increasing due in large part to its clean, pollution-free characteristics.

The core of a photovoltaic power generation system that directly converts the energy of solar rays into electricity is a solar cell made of a monocrystalline, polycrystalline, or amorphous silicon-based semiconductor. In the structure of a solar cell, solar cell devices are arranged in series or parallel, and several types of packaging are performed to unitize and protect the cell for a long time (about 20 years). The resulting units are referred to as solar cell modules.

In general, the solar cell has a constitution in which a surface hit by solar rays is covered by glass, a gap is filled with a filler that is a thermoplastic material (particularly, ethylene-vinyl acetate copolymer (EVA)), and the opposite surface is protected with a white sheet made of a heat- and weather-resistant plastic.

Since performance of solar cells needs to be maintained for about 20 years, a fluorine-based resin has been used as a rear surface protection sheet for durability, weather-resistance, etc. However, the fluorine-based resin has low mechanical strength and it is degraded at a temperature of 140 to 150° C. of a heat press performed to manufacture a solar cell module, and also is expensive, hindering the reduction of solar cell module prices.

As the fluorine-based resin, a polyvinylidene fluoride (PVDF) resin mixed with about 30 wt % acrylic resin exhibits optimal properties of adhesion, toughness, optical transparency, etc. However, the PVDF/acrylic resin blend generally has a lower hardness, abrasion, etc. than the PVDF resin.

Consequently, there is a need to develop a backsheet that is low-priced and has improved heat-resistance, weather-resistance, etc.

SUMMARY OF THE INVENTION

The present invention is directed to providing a solar cell backsheet capable of improving heat-resistance, weather-resistance, productivity, etc. of solar cells.

The present invention is also directed to providing a method of manufacturing the solar cell backsheet, and a solar cell including the solar cell backsheet.

According to an aspect of the present invention, there is provided a solar cell backsheet including: a substrate layer; and a blended resin layer including a fluorine-based resin and a (meth)acrylic-based copolymer resin including a (meth)acrylic-based monomer and a maleimide-based monomer formed on at least one surface of the substrate layer.

According to another aspect of the present invention, there is provided a method of manufacturing a solar cell backsheet including: preparing a substrate layer; and coating at least one surface of the substrate layer with a blended resin composition of a fluorine-based resin and a (meth)acrylic-based copolymer resin including a (meth)acrylic-based monomer and a maleimide-based monomer.

According to still another aspect of the present invention, there is provided a method of manufacturing a solar cell backsheet including: preparing a substrate layer; and stacking a blended resin layer of a fluorine-based resin and a (meth)acrylic-based copolymer resin including a (meth)acrylic-based monomer and a maleimide-based monomer on at least one surface of the substrate layer.

According to yet another aspect of the present invention, there is provided a solar cell including the solar cell backsheet.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 shows a structure of a solar cell backsheet according to an exemplary embodiment of the present invention.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

A solar cell backsheet according to an exemplary embodiment of the present invention includes a substrate layer, and a blended resin layer formed on at least one surface of the substrate layer and including a fluorine-based resin and a (meth)acrylic-based copolymer resin including a (meth)acrylic-based monomer and a maleimide-based monomer.

In the solar cell backsheet according to an exemplary embodiment of the present invention, the substrate layer may be selected according to a required function, use, etc., and more specifically, may be a metal substrate, a polyester-based resin layer, etc.

The polyester-based resin layer may be formed of polyethylene terephthalate (PET), polyethylene naphthalate (PEN), polybutylene terephthalate (PBT), etc. Here, PET is more preferred than others, but the present invention is not limited to PET.

In the solar cell backsheet according to an exemplary embodiment of the present invention, the fluorine-based resin of the blended resin layer may be selected according to a required function, use, etc., and more specifically, may be polyvinylidene fluoride (PVDF).

In the solar cell backsheet according to an exemplary embodiment of the present invention, it is to be understood that the (meth)acrylic-based monomer of the blended resin layer includes a (meth)acrylic derivative as well as (meth) acrylate.

To be specific, the (meth)acrylic-based monomer may include methyl methacrylate (MMA), methyl acrylate, ethyl acrylate, butyl acrylate, 2-ethylhexyl methacrylate, lauryl methacrylate, benzyl methacrylate, etc. but is not limited thereto. In particular, it is most preferable to use MMA.

In the solar cell backsheet according to an exemplary embodiment of the present invention, the maleimide-based monomer of the blended resin layer may include N-cyclohexylmaleimide, N-pheylmaleimide, N-methylmaleimide, N-butylmaleimide, N-benzylmaleimide, N-pyrenylmaleimide, etc. but is not limited thereto. In particular, it is most preferable to use N-cyclohexylmaleimide.

The amount of the (meth)acrylic-based monomer may be 50 to 99 wt % based on 100 wt % of the (meth)acrylic-based copolymer, preferably 70 to 99 wt %, and more preferably 70 to 98 wt %. Also, the amount of the maleimide-based monomer may be 1 to 50 wt %, preferably 1 to 30 wt %, and more preferably 2 to 30 wt % based on 100 wt % of the (meth)acrylic-based copolymer.

The (meth)acrylic-based copolymer includes the (meth)acrylic-based monomer and the maleimide-based monomer, and may be prepared by bulk polymerization, solution polymerization, suspension polymerization, emulsion polymerization, etc.

In the solar cell backsheet according to an exemplary embodiment of the present invention, the amount of the fluorine-based resin may be 50 to 99 wt %, and more preferably 60 to 80 wt %, and the amount of the (meth) acrylic-based copolymer resin may be 1 to 50 wt %, and more preferably 20 to 40 wt % based on 100 wt % of the blended resin layer.

In the solar cell backsheet according to an exemplary embodiment of the present invention, a thickness of the blended resin layer may be 10 to 250 micrometers, and more preferably 20 to 100 micrometers.

In the solar cell backsheet according to an exemplary embodiment of the present invention, the blended resin layer may be formed on one surface of the substrate layer, or on both surfaces of the substrate layer.

The solar cell backsheet according to an exemplary embodiment of the present invention may include an additional adhesive layer between the substrate layer and the blended resin layer.

The adhesive layer may be formed of a dry laminate adhesive. More specifically, the adhesive layer may include a polyurethane adhesive. The adhesive layer including the polyurethane adhesive may prevent deterioration in adhesion, delamination, etc. of a barrier sheet caused by using the solar cell backsheet outdoors for a long time, and may also reduce yellowing of the adhesive layer itself.

In the solar cell backsheet according to an exemplary embodiment of the present invention, the substrate layer or the blended resin layer may additionally include a white pigment. The white pigment may improve the power generation efficiency of a solar cell device, and may be a white additive, for example, titanium oxide ($TiO_2$), silica, alumina, calcium carbonate, and barium sulfate.

In the solar cell backsheet according to an exemplary embodiment of the present invention, the blended resin layer may additionally include one or more kinds of light stabilizers. The light stabilizers absorb ultraviolet (UV) rays, and more specifically, may include hydroxybenzophenones, hydroxybenzotriazoles, hindered amine light stabilizers (HALS), an antioxidant, a heat stabilizer, etc.

In the solar cell backsheet according to an exemplary embodiment of the present invention, the blended resin layer may additionally include barrier particles. Plate-shaped particles are preferred as the barrier particles. Such particles can improve the moisture barrier property of a fluorine-based resin layer in a solar cell module, and thus can further improve the performance of protecting a solar cell.

The barrier particles may include mica particles, glass flakes, stainless steel flakes, aluminum flakes, etc., and more preferably, may include mica particles. The mica particles may be generally coated with an oxide layer such as an iron oxide and a titanium oxide.

A method of manufacturing a solar cell backsheet according to an exemplary embodiment of the present invention includes: preparing a substrate layer; and coating at least one surface of the substrate layer with a blended resin composition of a fluorine-based resin and a (meth)acrylic-based copolymer resin including a (meth)acrylic-based monomer and a maleimide-based monomer.

The method of manufacturing a solar cell backsheet according to an exemplary embodiment of the present invention may additionally include drying the coated composition at a temperature of 25 to 250° C., preferably 200° C., for three minutes or more after coating the at least one surface of the substrate layer with the blended resin composition.

A method of manufacturing a solar cell backsheet according to another exemplary embodiment of the present invention includes: preparing a substrate layer; and stacking a blended resin layer of a fluorine-based resin and a (meth)acrylic-based copolymer resin including a (meth)acrylic-based monomer and a maleimide-based monomer on at least one surface of the substrate layer.

When the blended resin composition is stacked on the substrate layer, an additional adhesive layer may be included between the blended resin layer and the substrate layer.

In the method of manufacturing a solar cell backsheet according to the present invention, the substrate layer, the blended resin layer of the fluorine-based resin and the (meth)acrylic-based copolymer resin including the (meth) acrylic-based monomer and the maleimide-based monomer, the adhesive layer, etc. are the same as described above, and the detailed description thereof will be omitted.

An exemplary embodiment of the present invention also provides a solar cell including the solar cell backsheet.

The solar cell according to the present invention may have a constitution in which a gap between cells of solar cell arranged in series or parallel is filled with a filler that is a thermoplastic material (ethylene-vinyl acetate copolymer (EVA)), a surface hit by solar rays is covered by glass, and the opposite surface is protected by a solar cell backsheet according to an exemplary embodiment of the present invention, but the present invention is not limited to this constitution only.

The solar cell may be manufactured in a way known in the art except that a solar cell backsheet according to an exemplary embodiment of the present invention is included.

A solar cell backsheet and a solar cell employing the solar cell backsheet according to exemplary embodiments of the present invention use a blended composition of a fluorine-based resin and a (meth)acrylic-based copolymer resin including a maleimide-based monomer, thus having improved heat-resistance and mechanical properties and lower material cost.

EXAMPLES

Example 1

Coating of PET Layer with Fluorine-Based Resin Layer

A PVDF resin and a poly(N-cyclohexylmaleimide-co-methylmethacrylate) resin were dissolved in dimethylacetamide (DMAc) at a weight ratio of 75:25 to prepare a 18 wt % total solid content (TSC) solution. Here, titanium oxide ($TiO_2$, DuPont™ Light Stabilizer 210) was introduced in an amount of 15 parts by weight with respect to 100 parts by weight of the total resins to serve as a white pigment and absorb UV rays. This solution was filtered through a 5-micrometer filter and then coated on a PET film. As the PET film, PET (SKC, SH82) having a thickness of 100 micrometers was used, and was a biaxially oriented film having both surfaces coated with an acrylic polymer as a primer. Using a doctor blade, a coating thickness was adjusted to 30 to 40 micrometers, and a coating speed was 6 mm/sec. After coating, the film was dried at room temperature for five minutes and then at 120° C. for 30 minutes. Finally, the film was installed on a frame and dried at 200° C. for three minutes. After one surface of the PET film was coated with the solution, the other surface was coated in the same way.

Characteristics of the manufactured backsheet film are shown in Table 2 below.

Example 2

Stacking of Fluorine-Based Resin Layer on PET Layer

1) Manufacturing of Blended Film of PVDF and Poly(N-cyclohexylmaleimide-co-methylmethacrylate)

A resin composition in which a PVDF resin and a poly(N-cyclohexylmaleimide-co-methylmethacrylate) resin were uniformly mixed at a weight ratio of 75:25 was supplied to a 16Φ extruder substituted by nitrogen from a raw material hopper to an extruder, and melted at 230° C. to manufacture raw material pellets. While the pellets were being manufactured, titanium oxide ($TiO_2$, DuPont™ Light Stabilizer 210) was introduced in an amount of 15 parts by weight with respect to 100 parts by weight of the total resins to serve as a white pigment and absorb UV rays. SOLEF 1010 of Solvey Co. was used as the PVDF resin, and nuclear magnetic resonance (NMR) analysis of the poly(N-cyclohexylmaleimide-co-methylmethacrylate) resin revealed that the amount of N-cyclohexylmaleimide was 6.5 wt %. The obtained raw material pellets were dried in a vacuum, melted by the extruder at 230° C., and passed through a coat hanger type T-die, a chrome plating casting roll, a dry roll, etc. to manufacture a film having a thickness of 50 micrometers.

2) Stacking of PVDF Blended Film and PET

Stacking was performed using an EXCELAM-PLUS655RM laminator of GMP Co.

Using a polyurethane (PU) adhesive, a fluorine-based film and the PET film were stacked. The composition of the used polyurethane adhesive is shown in Table 1 below.

TABLE 1

| Ingredient | Polyol | HDDI | Reaction Catalyst | MEK (based on Polyol TSC 90%) |
|---|---|---|---|---|
| Amount (g) | 1.3 | 0.3 | 0.3 | 0.2 |

Polyol: Desmophen 670 Bayer
Hexanediol Diisocyanate (HDDI): Hexane-1,6-diisocyanate
Reaction Catalyst: 1% tetrahydrofuran (THF), Di-n-butyltin dilaurate >94% (typically 98+%)

Corona discharge was performed on the PET film 15 times, the adhesive was applied to the PET film, and then the PET film was dried at 80° C. for two minutes. After corona discharge was performed on a PVDF-830HR extrusion film 15 times, the two films were laminated (reciprocate three times) by a laminator at 110° C. The films were hardened at 80° C. for ten minutes and then hardened at room temperature for 12 hours or more.

Characteristics of the manufactured backsheet film are shown in Table 2 below.

Comparative Example 1

A film was manufactured in the same way as Example 1 above except that a polymethylmethacrylate resin was used instead of the poly(N-cyclohexylmaleimide-co-methylmethacrylate) resin.

Characteristics of the manufactured backsheet film are shown in Table 2 below.

Comparative Example 2

A film was manufactured in the same way as Example 2 above except that a polymethylmethacrylate resin was used instead of the poly(N-cyclohexylmaleimide-co-methylmethacrylate) resin.

Characteristics of the manufactured backsheet film are shown in Table 2 below.

TABLE 2

| | Film Forming Method | Structure | Thickness (μm) | Tg (° C., PVDF layer) | WVTR (g/m² · day) |
|---|---|---|---|---|---|
| Example 1 | Coating | PVDF blended resin layer/ | 25 | 65 | 3.4 |
| | | PET/ | 100 | | |
| | | PVDF blended film | 25 | | |
| Example 2 | Stacking | PVDF blended film/ | 50 | 65 | 2.1 |
| | | Adhesive layer/ | 20 | | |
| | | PET/ | 100 | | |
| | | Adhesive layer/ | 20 | | |
| | | PVDF blended film | 50 | | |
| Comparative Example 1 | Coating | PVDF blended resin layer/ | 35 | 55 | 2.8 |
| | | PET/ | 100 | | |
| | | PVDF blended resin layer | 20 | | |
| Comparative Example 2 | Stacking | PVDF blended film/ | 50 | 55 | 2.2 |
| | | Adhesive layer/ | 20 | | |
| | | PET | 100 | | |
| | | Adhesive layer/ | 20 | | |
| | | PVDF blended film | 50 | | |

Characteristics of the water vapor transmission rate (WVTR) were measured using L80-5000 of PBI Dansensor Inc. under conditions of 90% relative humidity (RH) and 38° C.

In Example 1 and Comparative example 1, a coated PVDF blended resin layer was peeled off to measure glass transition temperature (Tg) as data showing heat-resistance, and in Example 2 and Comparative Example 2, glass transition temperature (Tg) of a PVDF blended film was measured as data showing heat-resistance. The glass transition temperatures (Tg) were measured by a differential scanning calorimeter (DSC2010) of TA instrument Inc. Analysis was carried out at a heating rate of 10° C./min in a nitrogen atmosphere, and the intermediate temperature of a section in which heat capacity suddenly changes in the second scanning was taken as the glass transition temperature.

It can be seen that poly(N-cyclohexylmaleimide-co-methylmethacrylate) resin yielded an at least 10° C. higher glass transition temperature than polymethylmethacrylate.

EXPERIMENTAL EXAMPLE

Evaluation of Backsheet Characteristics 1. 180° Peel Strength

In a laboratory, a backsheet is manufactured by stacking a PVDF-830HR layer on a PET, and thus adhesion between the PET and the PVDF-830HR layer is a main factor determining the durability of the backsheet. Adhesion between the backsheet and an encapsulated EVA, and between the encapsulated EVA and glass are also important, but only adhesion between respective layers of the backsheet were examined here.

After the backsheet was fixed onto a glass plate using a double-sided adhesive tape, a layer to be peeled off was slightly peeled off, and then a PET film was connected to the layer by a tape and fixed to an upper grip. With the lower portion of the glass plate fixed to a lower grip while the upper grip moved upward, 180° peeling was performed to measure peel strength. The results are shown in Table 3 below.

TABLE 3

| Stacking method | Sample | Peel strength (N/cm) |
| --- | --- | --- |
| Coating | Example 1 | 7.6 |
| PU adhesive lamination | Example 2 | 9.6 |
| Commercial product | Tedlar/PET | 4.2 |

As shown in Table 3 above, the measured peel strength of backsheet samples manufactured by coating and lamination was higher than that of the commercial Tedlar/PET product.

2. Breakdown Voltage Measurement

A main function of a solar cell backsheet is to insulate the solar cell encapsulated by EVA from the outside. As a measure of insulation performance, a breakdown voltage, i.e., the minimum voltage causing a film to become electrically conductive, is used.

ASTM D149 and KSC 2127 were referred to for a measurement method, and chroma (9056-20k, 0~10 kV DC) was used as a withstand voltage measuring device. The results are shown in Table 4 below.

TABLE 4

| Stacking method | Sample | Breakdown Voltage (kV) | Thickness (μm) |
| --- | --- | --- | --- |
| Coating | Example 1 | 11 | 150 |
| PU adhesive lamination | Example 2 | 13 | 240 |
| Commercial product | AKASOL (PDF/PET/PDF) | 12 | 175 |

A solar cell backsheet and a solar cell employing the same according to exemplary embodiments of the present invention make use of a blended composition of a fluorine-based resin and a (meth)acrylic-based copolymer resin including a maleimide-based monomer, thus having improved heat-resistance and mechanical properties, and lower material cost.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A solar cell backsheet, comprising:
a substrate layer having a first surface and an opposing second surface, the substrate layer is metal, polyethylene terephthalate (PET), polyethylene naphthalate (PEN), or polybutylene terephthalate (PBT);
a first and second blended resin layer, each blended resin layer comprising a fluorine-based resin and a (meth)acrylic-based copolymer resin including a (meth)acrylic-based monomer
and a maleimide-based monomer, the first blended resin layer formed on the first
surface of the substrate layer, and the second blended resin layer formed on the second surface of the substrate layer; and
an adhesive layer between the substrate layer and each of the blended resin layers,
wherein each adhesive layer includes a polyurethane adhesive,
wherein the amount of the (meth)acrylic-based monomer is 50 to 99 wt %, and the amount of the maleimide-based monomer is 1 to 50 wt % based on 100 wt % of the (meth)acrylic-based copolymer,
wherein the maleimide-based monomer of the blended resin layer comprises at least one selected from the group of N-cyclohexylmaleimide, N-phenylmaleimide, N-methylmaleimide, N-butylmaleimide, N-benzylmaleimide, and N-pyrenylmaleimide, and
wherein the amount of the fluorine-based resin is 75 to 99 wt %, and the amount of the (meth)acrylic-based copolymer is 1 to 25 wt % based on 100 wt % of the blended resin layer.

2. The solar cell backsheet of claim 1, wherein the fluorine-based resin of the blended resin layer is a polyvinylidene fluoride (PVDF) resin.

3. The solar cell backsheet of claim 1, wherein the (meth)acrylic-based monomer of the blended resin layer comprises at least one selected from the group of methyl methacrylate (MMA), methyl acrylate, ethyl acrylate, butyl acrylate, 2-ethylhexyl methacrylate, lauryl methacrylate, and benzyl methacrylate.

4. The solar cell backsheet of claim 1, wherein a thickness of the blended resin layers is 10 to 250 micrometers.

5. The solar cell backsheet of claim 1, wherein the substrate layer or the blended resin layers further comprises a white pigment.

6. The solar cell backsheet of claim 1, wherein the blended resin layers further comprises light stabilizer.

7. A solar cell having a first side constructed to receive incident solar rays, and an opposing side, the opposing side including the solar cell backsheet of claim 1.

8. The solar cell backsheet of claim 1, wherein the blended resin layers comprises plate-shaped barrier particles.

9. The solar cell backsheet of claim 8, wherein the barrier particles comprises mica particles, glass flakes, stainless steel flakes, or aluminum flakes.

* * * * *